(12) United States Patent
Eisner et al.

(10) Patent No.: US 7,594,200 B2
(45) Date of Patent: Sep. 22, 2009

(54) METHOD FOR FINDING MULTI-CYCLE CLOCK GATING

(75) Inventors: Cynthia Rae Eisner, Zichron Ya'akov (IL); Monica Farkash, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 236 days.

(21) Appl. No.: 11/311,756

(22) Filed: Dec. 19, 2005

(65) Prior Publication Data

US 2007/0157130 A1   Jul. 5, 2007

(51) Int. Cl.
   *G06F 17/50*   (2006.01)
(52) U.S. Cl. ............................................ 716/2; 716/18
(58) Field of Classification Search .................... 716/2, 716/18
   See application file for complete search history.

(56) References Cited

U.S. PATENT DOCUMENTS

| | | | |
|---|---|---|---|
| 5,980,092 A | 11/1999 | Merryman et al. | |
| 6,247,134 B1 | 6/2001 | Sproch et al. | |
| 6,434,704 B1* | 8/2002 | Dean et al. | 713/320 |
| 7,080,334 B2* | 7/2006 | Fan et al. | 716/6 |
| 7,131,090 B2* | 10/2006 | Wilcox et al. | 716/6 |
| 7,376,856 B2* | 5/2008 | Negishi et al. | 713/401 |
| 2002/0199125 A1* | 12/2002 | Chieco et al. | 713/401 |
| 2004/0004504 A1 | 1/2004 | Wilcox et al. | |
| 2004/0021485 A1 | 2/2004 | Kanazawa et al. | |
| 2004/0098685 A1* | 5/2004 | Higuchi | 716/6 |
| 2004/0150427 A1 | 8/2004 | Wilcox et al. | |
| 2004/0225978 A1* | 11/2004 | Fan et al. | 716/6 |
| 2004/0237057 A1* | 11/2004 | Prasad et al. | 716/3 |
| 2005/0097487 A1* | 5/2005 | Lauritzen et al. | 716/6 |

OTHER PUBLICATIONS

L. Benini, G. De Micheli, E. Macii, M. Poncino, R. Scarsi, "Symbolic Synthesis of Clock-Gating Logic for Power Optimization of Control-Oriented Synchronous Networks", 1997 European Design and Test Conference.
F. Theeuwen, E. Seelen, "Power reduction through clock gating by symbolic manipulation", Proc. IFIP Int. Workshop on Logic and Architecture Synthesis, 1996.
R. Tzoref, M. Matusevich, E. Berger, I. Beer, "An Optimized Symbolic Bounded Model Checking Engine", CHARME 2003.

(Continued)

*Primary Examiner*—Jack Chiang
*Assistant Examiner*—Magid Y Dimyan

(57) ABSTRACT

An apparatus includes a multi-cycle clock gater and a circuit design updater. The multi-cycle clock gater generates multi-cycle gating groups of data latching devices of a circuit design. The circuit design updater updates the circuit design with selected multi-cycle gating groups. Each gating group is associated with a single gating function. For each gating group, data latching devices of $0^{th}$ level of the gating group are gated with the gating function and ith level data latching devices of the gating function are gated with ith latched versions of the gating function.

4 Claims, 7 Drawing Sheets

OTHER PUBLICATIONS

N. Raghavan, V. Akella, S. Bakshi, "Automatic Insertion of Gated Clocks at Register Transfer Level", Proc. Twelfth International Conference on VLSI Design, 1999.

T. Lang, E. Musoll, J. Cortadella, "Individual Flip-Flops with Gated Clocks for Low Power Datapaths", IEEE Transactions on Circuits and Systems—II: Analog and Digital Signal Processing, vol. 44, No. 6, Jun. 1997.

L. Benini et al., "Saving Power by Synthesizing Gated Clocks for Sequential Circuits", IEEE Design & Test of Computers, IEEE Service Center NY, US, vol. 11, No. 4, Dec. 21, 1994, pp. 32-41.

Amir H. Farrahhi et al., "Activity-Driven Clock Design", IEEE Transactions on Computer Aided Design of Integrated Circuits and systems, IEEE Service Center, Piscataway, NJ, vol. 20, No. 6, Jun. 2001.

* cited by examiner

METHOD FOR FINDING MULTI-CYCLE CLOCK GATING

FIELD OF THE INVENTION

The present invention relates to circuit design generally and to clock gating of flip-flops in particular.

BACKGROUND OF THE INVENTION

Complicated pieces of hardware typically comprise millions of transistors. Circuit designers typically utilize computer-aided design programs to aid their design process. Once a designer has finished the conceptual design of a circuit, there are many optimizations which can be made.

For example, for low power design, it is often useful to add logic elements to keep other elements from operating when they are not needed.

Reference is now made to FIGS. 1A and 1B, which illustrate the changes that may be made for low power operation. FIG. 1A shows a first circuit 10 having a flip-flop 12. Like all flip-flops, flip-flop 12 is controlled by a clock signal CLK. When clock signal CLK goes high, flip-flop 12 puts out a value Q calculated from its input I, which may be a function of a logic circuit 14, which, in turn, may be a function of a plurality of inputs (a, b and c are shown). Flip-flop 12 will perform the calculation, irrespective of whether or not input I has changed. A circuit designer, when coming to determine how to minimize the power consumption of his circuit, may review the activities of the flip-flops and may "gate" those which he knows will not change value given a particular situation. To do so, the designer may add circuitry to disconnect the clock input to the flip-flop.

This change is shown in FIG. 1B. In the circuit, now labeled 10', flip-flop 12 remains as does logic circuit 14, but the clock signal to flip-flop 12 has changed. The clock signal, labeled GCLK, is now a gated clock signal which is only active when both clock signal CLK and an enable signal EN are active. Gated clock signal GCLK is generated with a gate 16. Clock-gating performed like this on an individual flip-flop is known as "fine-grained" clock gating.

Another method for clock-gating is known as "coarse-grained" clock gating. Under coarse-grained clock gating, a large number of flip-flops are shut off using the same clock gating function, thus providing a significant reduction in power usage. For example, sections of a circuit which operate as a single unit, such as a floating point unit, may be clock-gated.

Other candidates for clock gating are not always so easy to determine. Moreover, the logic function which determines when a circuit should be gated is implemented with logic gates, such as flip-flops. If the logic function is complicated compared to the circuit to be gated (i.e. it has more gates than the circuit being shut off), then the clock gating saves little, if any, power.

The following articles discuss automatic clock-gating methods:

L. Benini, G. De Micheli, E. Macii, M. Poncino, R. Scarsi, "Symbolic Synthesis of Clock-Gating Logic for Power Optimization of Control-Oriented Synchronous Networks", 1997 European Design and Test Conference;

F. Theeuwen, E. Seelen, "Power Reduction through Clock Gating by Symbolic Manipulation", Proc. IFIP Int. Workshop on Logic and Architecture Synthesis, 1996.

N. Raghavan, V. Akella, S. Bakshi, "Automatic Insertion of Gated Clocks at Register Transfer Level", Proc. Twelfth International Conference on VLSI Design, 1999; and T. Lang, E. Musoll, J. Cortadella, "Individual Flip-Flops with Gated Clocks for Low Power Datapaths", IEEE Transactions on Circuits and Systems-II: Analog and Digital Signal Processing, Vol. 44, No. 6, June 1997.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1A:
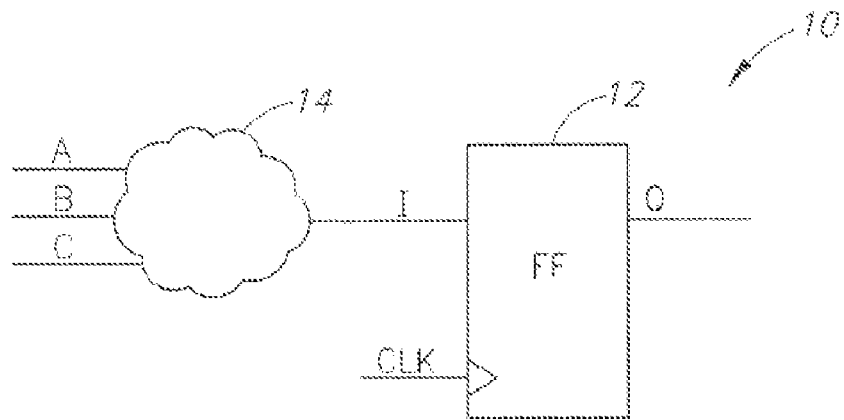
FIG. 1A is a schematic circuit diagram illustration of a circuit having a flip-flop therein.
Figure 1B:
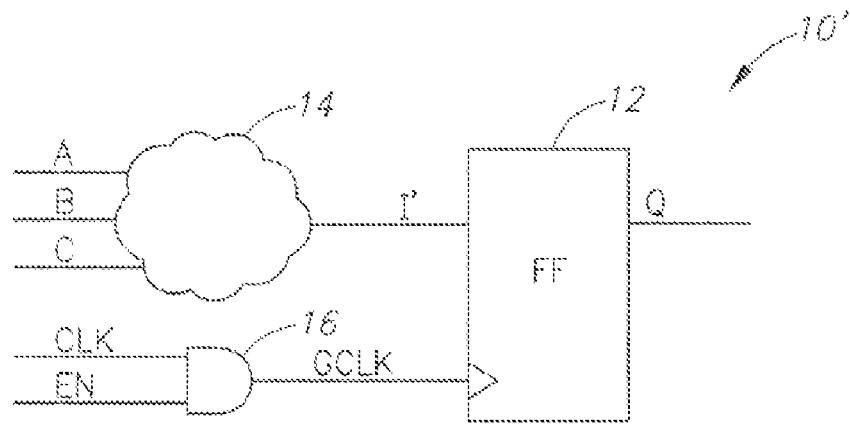
FIG. 1B is a schematic illustration of the circuit of FIG. 1A with clock gating on the flip-flop.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

SUMMARY OF THE PRESENT INVENTION

The present invention may be a method and system for finding multiple cycle clock gating opportunities.

There is therefore provided, in accordance with a preferred embodiment of the present invention, a unit which has a multi-cycle clock gater and a circuit design updater. The multi-cycle clock gater may generate multi-cycle gating groups of data latching devices of a circuit design. The circuit design updater may update the circuit design with selected multi-cycle gating groups.

Additionally, in accordance with a preferred embodiment of the present invention, each gating group may be associated with a single gating function. For each gating group, data latching devices of $0^{th}$ level of the gating group may be gated with the gating function and the ith level data latching devices of the gating function may be gated with ith latched versions of the gating function.

Moreover, in accordance with a preferred embodiment of the present invention, the data latching devices may be flip-flops or latches.

Further, in accordance with a first preferred embodiment of the present invention, the multi-cycle clock gater includes an indicator signal generator, an unfolder and a gating function determiner. The indicator signal generator may create indicator signals identifying conditions under which the values of data latching devices of an input circuit design do not change. The unfolder may unfold the circuit with the indicator signals a plurality K of times and the gating function determiner may determine a plurality of candidate gating functions for the multiplicity of flip-flops from at least the unfolded indicator signals.

Still further, in accordance with the first preferred embodiment of the present invention, the gating function determiner includes a binary decision diagram operator to build a binary decision diagram (BDD) X of the unfolded indicator signals ANDed together, to generate a BDD Y of X at a no change value and, for each time stamp k, to remove variables of a BDD $Y_k$ whose input is not from the kth cycle.

Moreover, in accordance with a second preferred embodiment of the present invention, the multi-cycle clock gater includes a circuit reviewer, a gating function determiner and a group generator. The circuit reviewer may find a group G of data latching devices of the circuit that depend only on an input cycle. The gating function determiner may determine a group $H_j$ of the data latching devices of the group G which share a jth gating function $F_j$ and the group generator may add, for each group $H_j$, the data latching devices of the circuit which receive input from existing data latching devices of group $H_j$.

Further, in accordance with the second preferred embodiment of the present invention, the group generator includes a level 0 definer to define, for each initial group $H_j$, the data latching devices therein as level 0 data latching devices and a non-level 0 definer to add, for each ith level, a data latching device of the circuit to group $H_j$ as a level i+1 data latching device if the data latching device depends only on a level i data latching device already present in group $H_j$.

Finally, in accordance with a preferred embodiment of the present invention, the present invention incorporates the methods implemented by the multi-cycle clock gater and the circuit design updater.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Unless specifically stated otherwise, it will be appreciated that discussions utilizing terms such as "processing," "computing," "calculating," "determining," or the like, refer to the action and/or processes of a computer, computing system, or similar electronic computing device that manipulates and/or transforms data represented as physical, such as electronic, quantities within the computing system's registers and/or memories into other data similarly represented as physical quantities within the computing system's memories, registers or other such information storage, transmission or display devices.

The processes and displays presented herein are not inherently related to any particular computer or other apparatus. In addition, embodiments of the present invention are not described with reference to any particular programming language. It will be appreciated that a variety of programming languages may be used to implement the teachings of the invention as described herein.

Applicants have realized that situations may exist in which the clock gating function for a particular flip-flop may be used in a latched form as the clock gating function for at least one other flip-flop. This may be known as "multi-cycle" clock gating because it may involve multiple cycles of flip-flops using the same, possibly latched, clock gating function.

It will be appreciated that, with the multi-cycle gating groups of the present invention, different flip-flops of a circuit get turned on/off at a different time, rather than turning off an entire section of a design together.

It will be appreciated that the multi-cycle gating groups may also gate "data dependent" states of flip-flops, where a data dependent state may be defined as a state when the output of the flip-flop depends on the data input values, and not only on the values of the control inputs. Data independent states are those states where the output of the flip-flop is the same irrespective of the data inputs. For instance, for a simple input function, such as (if EN=1 then f(A,B,C) else Q), there are two cases when the output Q will not change value: 1) when EN=0; and 2) when EN=1 and f(A,B,C)=Q. The first case does not depend on any of the input values A, B or C and thus, is data independent. The second case is data dependent since it depends on the input values A, B or C.

Figure 2:
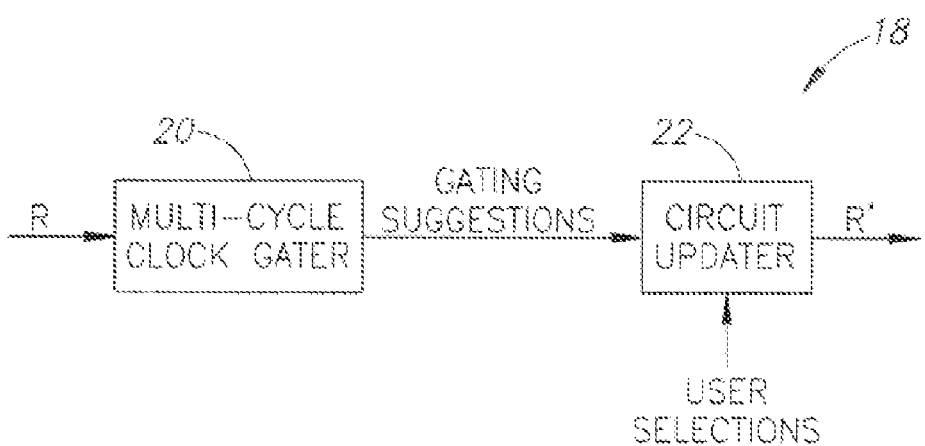
FIG. 2 is a block diagram illustration of a power reducing, circuit reviewer.

Reference is now made to FIG. 2, which illustrates a power reducing, circuit reviewer 18. Reviewer 18 may comprise a novel, multi-cycle clock gater 20 and a circuit updater 22. Multi-cycle clock gater 20 may review an input circuit design R to find potential, multi-cycle, clock gating opportunities and to generate logic functions to control the clocked gates. Circuit updater 22 may interact with a user, such as a circuit designer, to determine which potential opportunities the user wants to implement and may update circuit design R with the selected clock gates and their associated logic. The result may be an updated, lower power design R'.

Multi-cycle clock gater 20 may generate clock-gating logic functions which may be used for multiple cycles, thus reducing the overhead and/or allowing bigger functions (i.e. with more gates) to be used for clock gating.

Figure 3:
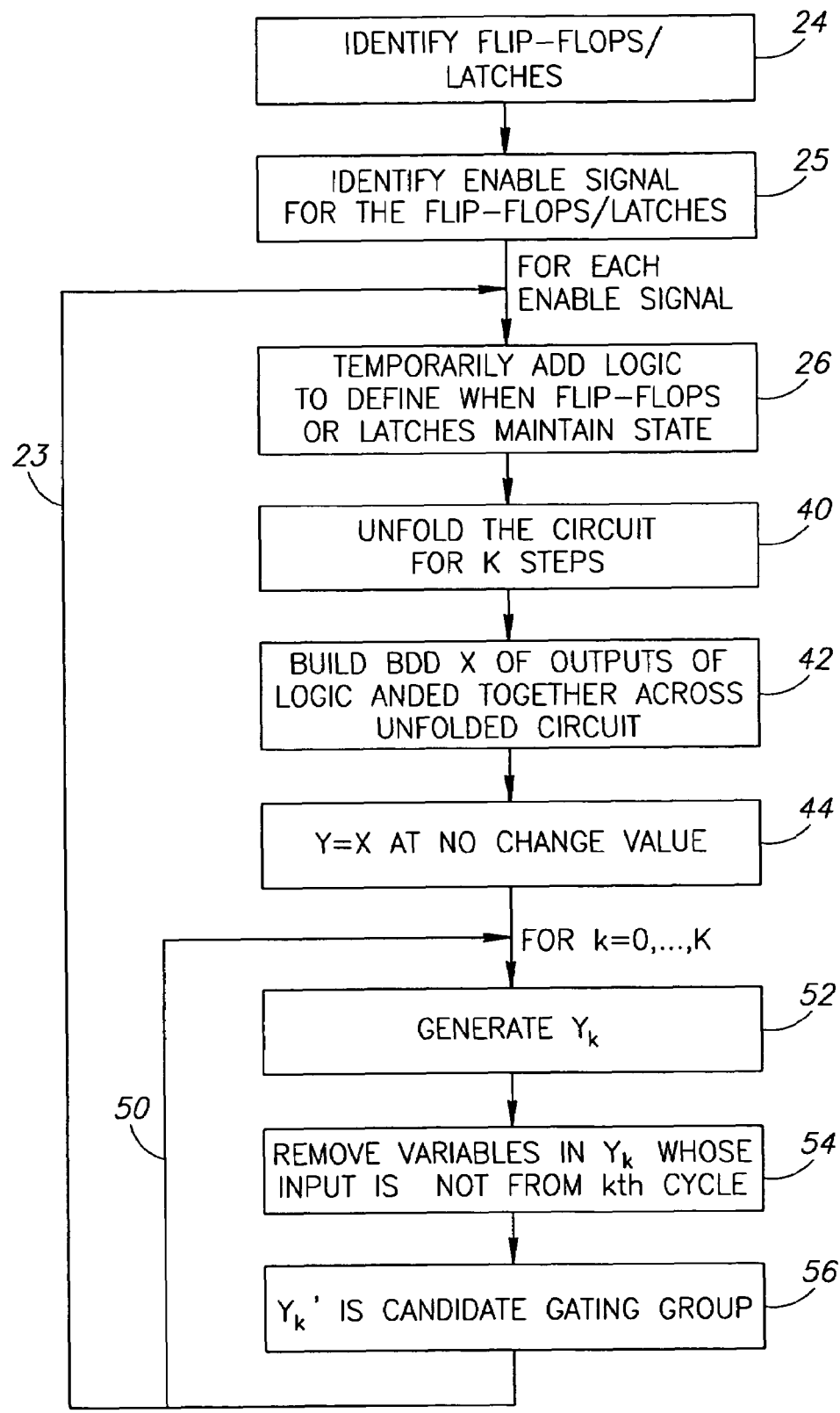
FIG. 3 is a flow chart illustration of a clock gating method, operative in accordance with a first embodiment of the present invention.

Multi-cycle clock gater 20 may operate by considering the circuit as a whole, without dividing the circuit into multiple units based on their operation. Reference is now made to FIG. 3, which illustrates the method performed by clock gater 20, and to FIGS. 4A, 4B and 4C, which are useful in understanding the steps of the method of FIG. 3.

Initially, clock gater 20 may review design R to identify (step 24) the flip-flops, latches or other data latching devices therein. The remaining discussion will use the term "flip-flop", since such are shown in FIGS. 4. However, it will be understood that the present invention is operative for all types of data latching devices.

In step 25, clock gater 20 may determine which enable signals control which flip-flops and may group the flip-flops accordingly. It will be appreciated that not all flip-flops may be controlled by enable signals and that not all enable signals may be utilized for gating. Some enable signals may control flip-flops having feedback loops therearound. Such enable signals may be converted to different enable signals using the method described in U.S. Patent Application "Clock Gating Through Data Independent Logic", filed Dec. 7, 2005 to the common assignee of the present invention, which disclosure is incorporated herein by reference.

Figure 4A:
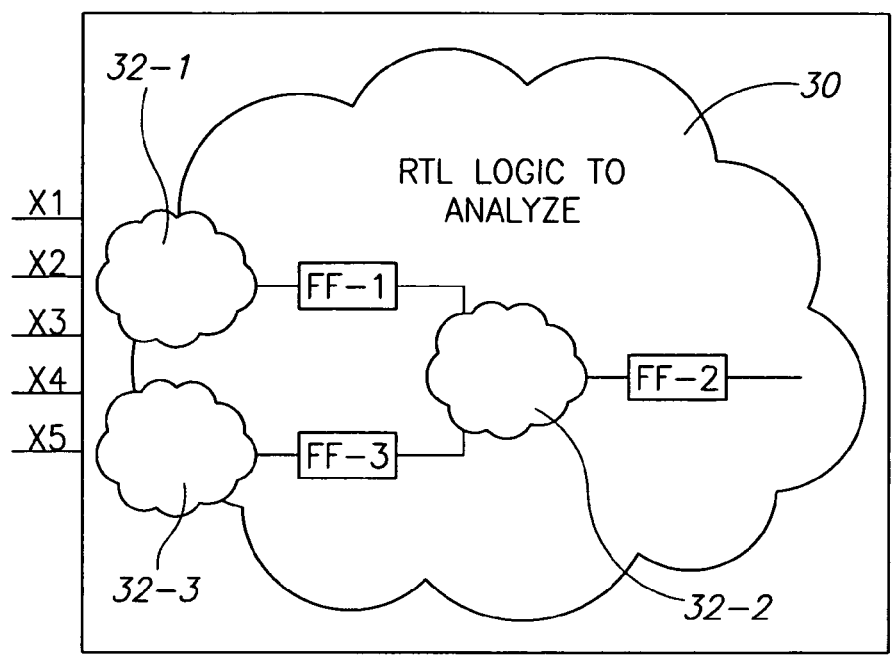
FIGS. 4A, 4B and 4C are schematic circuit diagram useful in understanding the steps of the method of FIG. 3.

For each enable signal thus determined (as checked in a loop 23), clock gater 20 may then temporarily add logic (step 26) which may identify conditions under which the value of either flip-flops in the circuit that are enabled by the current enable signal, or of flip-flops not assigned to any of the enable signals, do not change. For example, FIG. 4A shows a circuit 30 to be analyzed. It has five inputs x1, x2, x3, x4 and x5 and three flip-flops FF-1, FF-2 and FF-3. It also has combinational logic 32-1, 32-2 and 32-3, where logic 32-1 and 32-3 feed flip-flops FF-1 and FF-3 and logic 32-2 combines the outputs of flip-flops FF-1 and FF-3 to feed flip-flop FF-2.

Figure 4B:
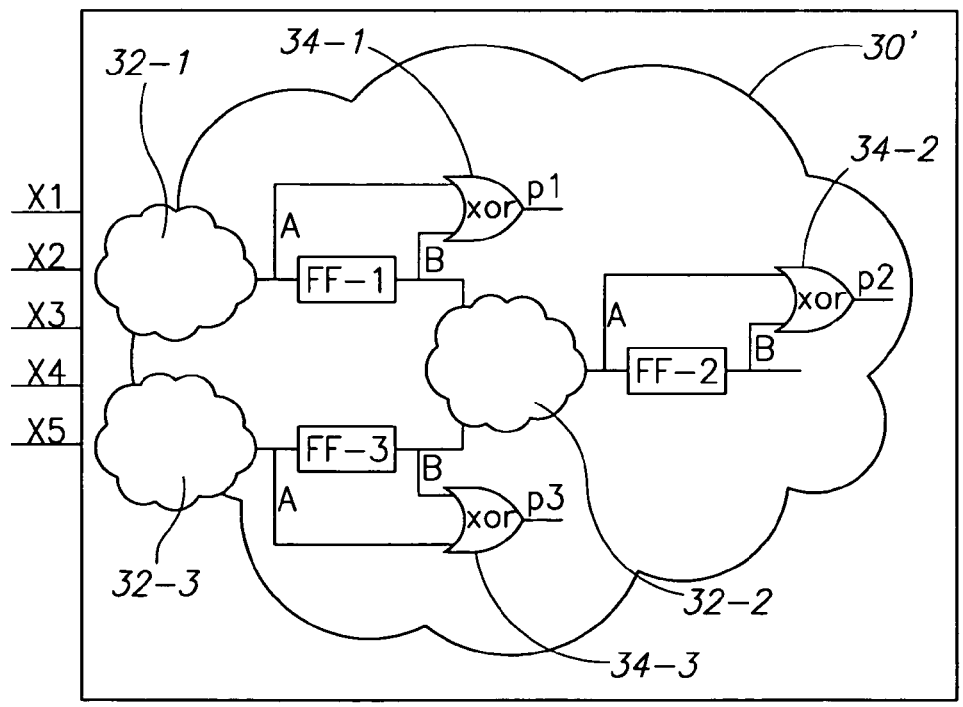

FIG. 4B shows the circuit, here labeled 30', after the addition of temporary logic 34-1, 34-2 and 34-3 associated with flip-flops FF-1, FF-2 and FF-3, respectively. In this example, each extra logic 34-i (for i=1, . . . , N, where N is the number of flip-flops in circuit 30) may be a XOR gate receiving the input A and output B of its associated flip-flip FF-i. The output signal of XOR 34-i may be an indicator signal pi and may have a value of 1 when the input A and output B of its associated flip-flop FF-i are different and a value of 0 when they are the same. Thus, indicator signal pi may indicate when flip-flop FF-i changes value and when it does not. Clock gater 20 may add the extra logic 34-i (i.e. the XORs in the example of FIG. 4B) into the RTL logic description.

Returning to FIG. 3, in step 40, clock gater 20 may "unfold" circuit 30' for K steps, where K is the depth of the logic of interest. For example, K might be defined as the number of flip-flops in the longest path from chip input to chip output, or from the input to a section of the chip to its output. In the example of FIG. 4, K might be 2, since there are only two levels of flip-flops (FF-1 and FF-3 at the first level and FF-2 at the second level).

"Unfolding" may be the process of virtually making a copy of circuit 30' for each time k. The article by R. Tzoref, M. Matusevich, E. Berger, I. Beer, entitled "An Optimized Symbolic Bounded Model Checking Engine", given at CHARME 2003, discusses the unfolding process within a symbolic model checker.

Figure 4C:
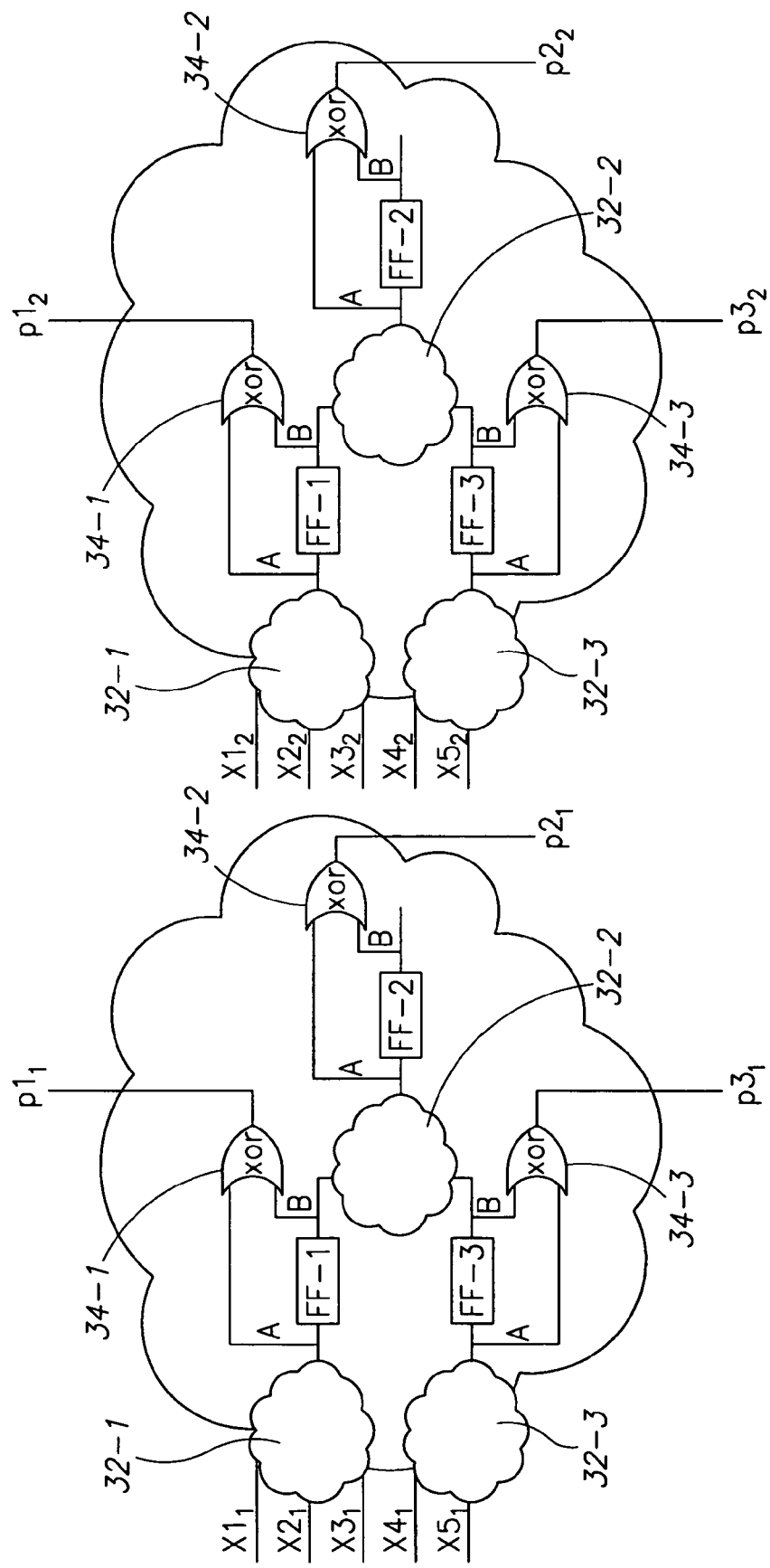

FIG. 4C shows the unfolding for the exemplary circuit 30' for two cycles 1 and 2. Each input signal xj is time-stamped as are the indicator signals pi. For example, FIG. 4C has two copies of input signal x1 ($x1_1$, $x1_2$) for the two cycles 1 and 2 and there are two copies of indicator signal p3 ($p3_1$, $p3_2$).

Returning to FIG. 3, clock gater 20 may then build (step 42) a binary decision diagram (BDD) X that represents the unfolded indicator signals $pi_k$ ANDed together. A binary decision diagram (BDD) is a generally compact representation of a Boolean expression and is commonly used in symbolic model checking, particularly of complicated hardware.

Figure 5:
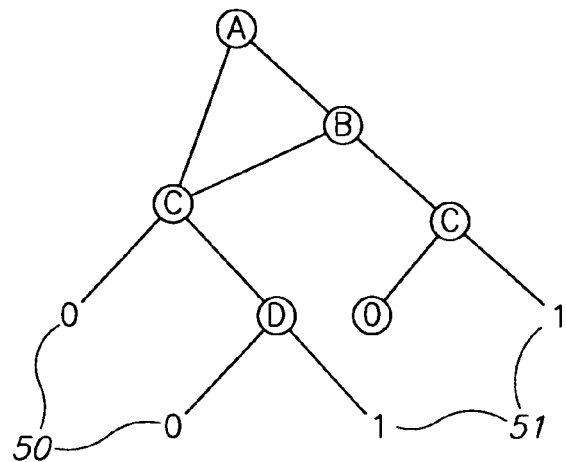
FIG. 5 is a schematic illustration of a binary decision diagram, useful in understanding the steps of the method of FIG. 3.

Briefly, a BDD is a directed acyclic graph that represents a Boolean expression. FIG. 5, to which reference may be now briefly made, shows an exemplary BDD for the expression ((A & B & C)|(C & D)), where "&" stands for "AND" and "|" stands for "OR". Each circle (or node) indicates a variable (A, B, C, D) and the lines indicate the directions to follow when the variable evaluates FALSE (on the left) or TRUE (on the right). Leaf nodes 51 represent the value of the Boolean expressions.

Thus, in step 42, clock gater 20 may utilize the RTL logic of amended circuit 30' to determine the Boolean expressions Qi defining each indicator signal pi. Since Boolean operations may be performed on a BDD, clock gater 20 may AND together all of the Boolean expressions Qi and their multiple copies $Qi_k$ to generate the BDD X.

In step 44, clock gater 20 may generate a no-change BDD having the value that indicator signals pi generate when flip-flops FF-i do not change values. In this embodiment, indicator signals pi generate a value of 0 when flip-flops FF-i do not change values and thus, for this embodiment, clock gater 20 may generate no change BDD Y by creating the BDD X=0.

In a loop 50 over k from 0 to K, clock gater 20 may determine a kth gating group by eliminating any indicator signal pi that depends on inputs $xj_k$ from cycles other than k. To do so, clock gater 20 may first generate (step 52) a temporary copy $Y_k$ of no change BDD Y for use in cycle k. Clock gater 20 may then remove (step 54) from temporary no change BDD $Y_k$ any indicator signals pi(not_k) which are functions of inputs $xj_{not\_k}$ from cycles other than k. The remaining indicator signals pi(remain) form a kth candidate gating group $Y_k$'.

Clock gater 20 may remove the undesirable signals pi(not_k) and may then perform standard compaction operations on BDD $Y_k$'. Such operations are known in the art and are discussed in the article by R. Bryant entitled "Graph-based algorithms for Boolean function manipulation", IEEE Transactions on Computers, Vol. C-35(8), 1986.

The remaining indicator signals pi(remain) that are left in kth candidate gating group $Y_k$' indicate the flip-flops FF-i that may be gated with the current enable signal and/or its latched form.

Gating groups which are large compared to the logic required to implement their gating function may be good candidates for clock gating. The size of a gating group may be defined by the number of flip-flops or other data latching devices therein.

When clock gater 20 finishes loops 23 and 50, clock gater 20 may have a set of candidate gating functions and their gating groups for review. Circuit updater 22 may provide these gating functions and their gating groups to the circuit designer who, in turn, may select which ones to implement, after which circuit updater 22 may then add the selected gating functions to the circuit, thereby generating the updated circuit R'.

Figure 6A:
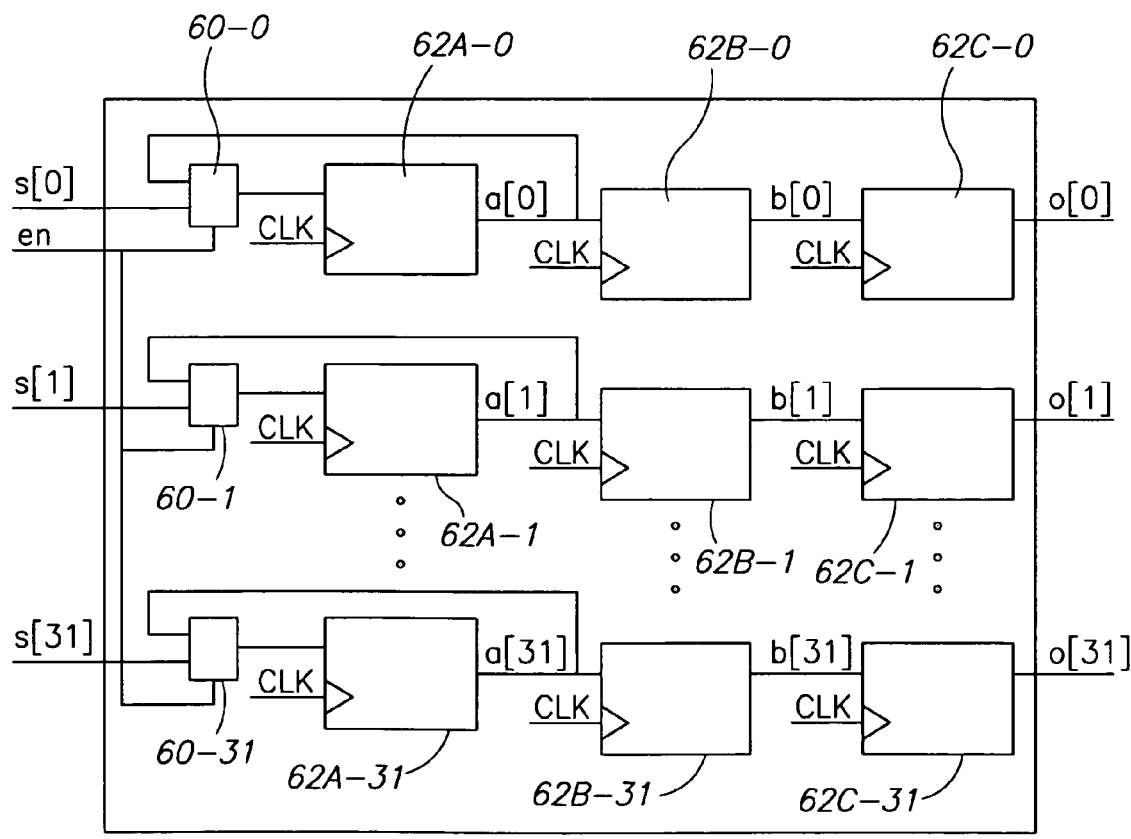
FIG. 6A is a circuit diagram illustration of an element with 32 repetitions of the same circuit.
Figure 6B:
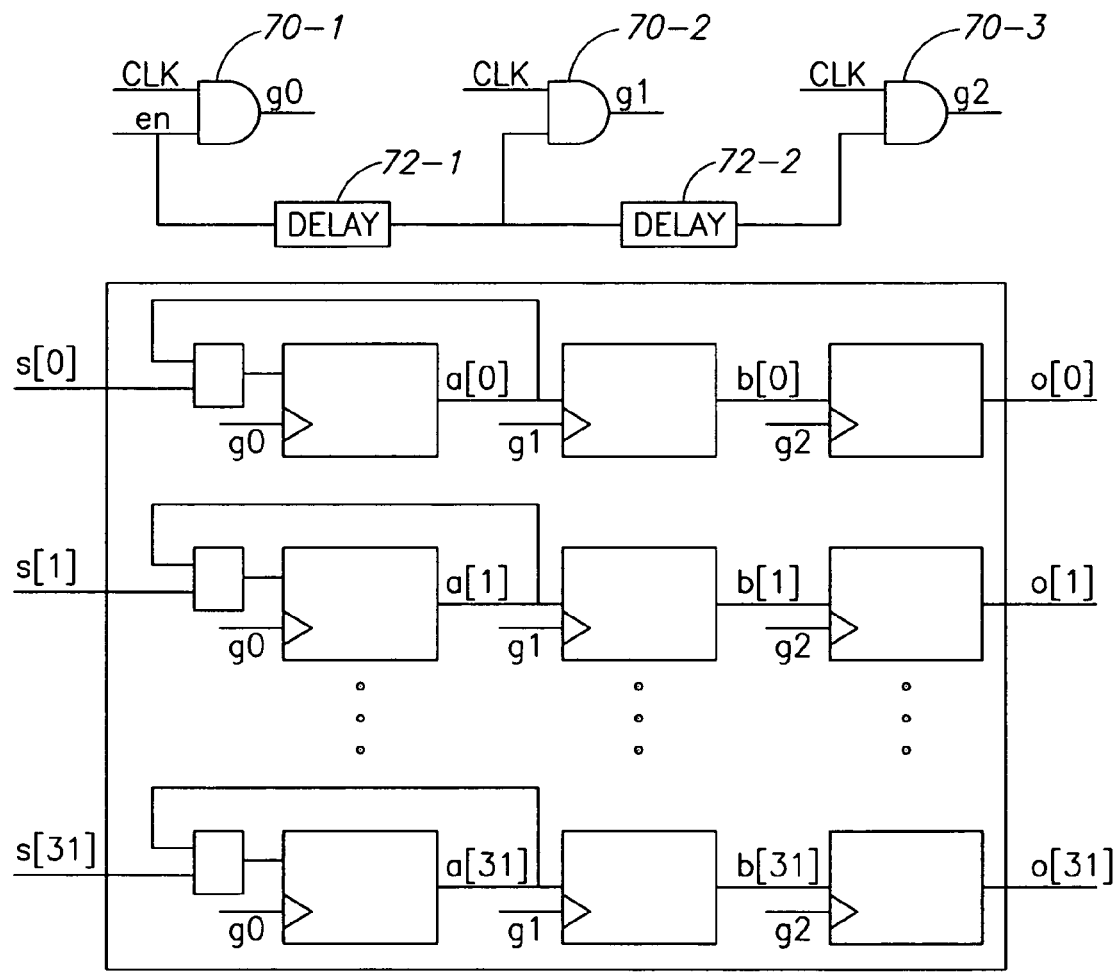
FIG. 6B is a circuit diagram illustration of a clock gated version of the circuit in FIG. 6A.

Reference is now briefly made to FIG. 6A, which shows a simple circuit with 32 repetitions n of the same element, and to FIG. 6B, which shows the clock gated version of the circuit. Each element n has an input s(n), a mux 60-n, and three concatenated flip-flops 62A-n, 62B-n and 62C-n. The outputs of flip-flop 62A-n, 62B-n and 62C-n are a(n), b(n) and o(n) and the input to mux 60-n is the input s(n), the signal en, and the output a(n) of flip-flop 62A-n. Muxes 60-n are enabled by an enable signal en.

For such a circuit, clock gater 20 may generate the following gating function, shown in FIG. 6B:

Gate the signals a(n) with the enable signal en, to generate gated clock g0;

Gate the signals b(n) with a latched version of enable signal en to generate gated clock g1; and Gate output signal o(n) with a doubly latched version of enable signal en to generate gated clock g2.

For this example, the overhead is three gates 70-1, 70-2 and 70-3 and two delays 72-1 and 72-2. In certain cases, this might be an acceptable overhead. It will be appreciated that, even if there is combinational logic between the simple circuits (so that, for instance, b(0) might be a function of a(0)-a(4)), the above gating will work.

Figure 7:
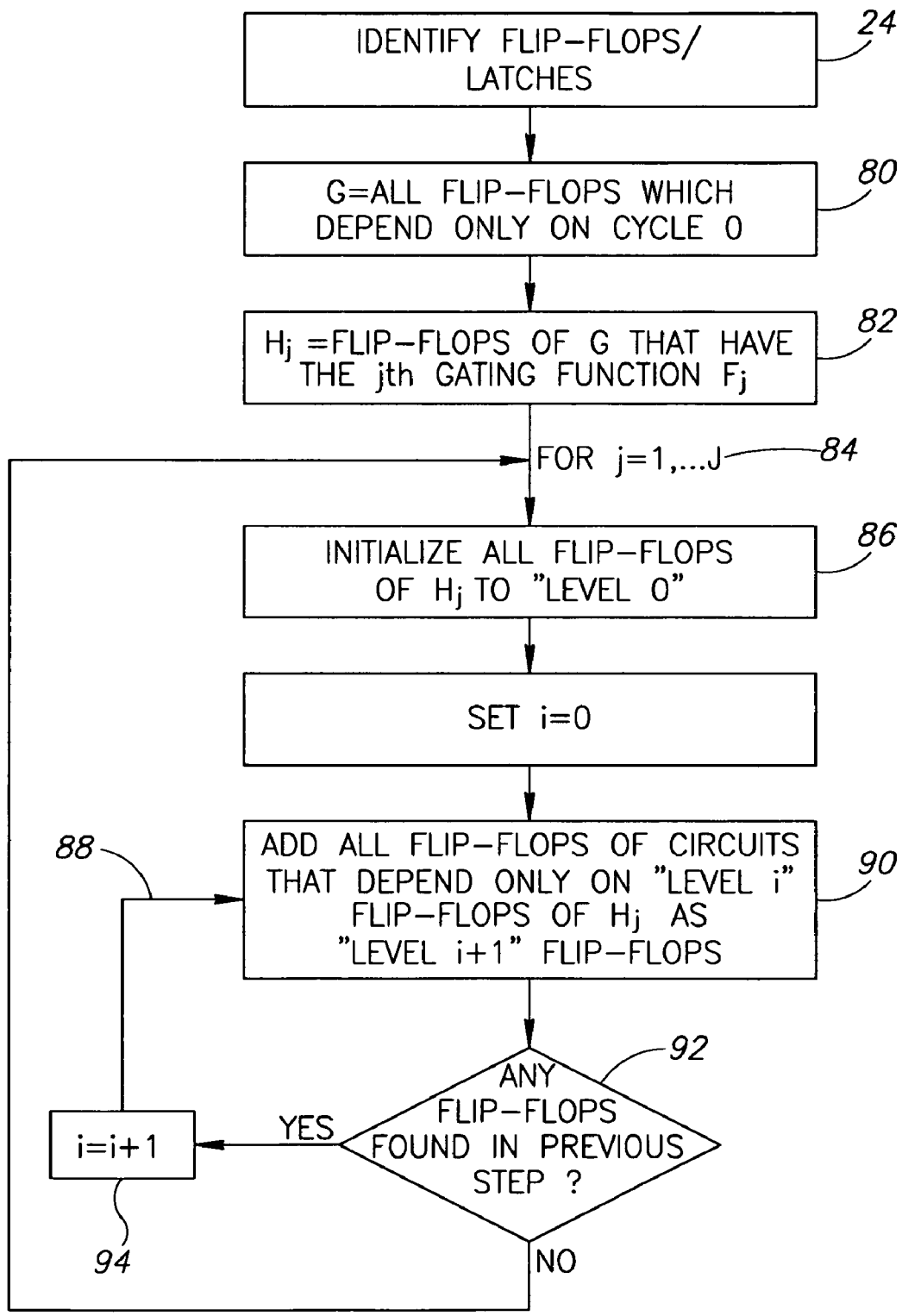
FIG. 7 is a flow chart illustration of a clock gating method, operative in accordance with a second embodiment of the present invention.

Reference is now made to FIG. 7, which illustrates an alternative method, to be performed by clock gater 20, for determining which data latching devices to clock-gate for multi-cycle clock gating.

As in the previous embodiment, clock gater 20 may initially review design R to identify (step 24) the data latching devices therein. Once again, the discussion below will use exemplary flip-flops, it being appreciated that all types of data latching devices are included.

In accordance with the alternative preferred embodiment of the present invention, clock gater 20 may traverse (step 80) a netlist of design R to determine which flip-flops depend only on inputs. This is a set G.

In step 82, clock gater 20 may review the "input-only" flip-flops G, identified in the previous step, to determine which ones operate according to the same clock-gating function $F_j$. Clock gating function $F_j$ may just be the enable functions to the input-only flip-flops G. Alternatively, clock-gating functions $F_j$ may be determined using standard algorithms for fine-grained clock-gating, such as that described in US U.S. Patent Application "Clock Gating Through Data Independent Logic", filed Dec. 7, 2005, mentioned hereinabove. The result may list the groups $H_j$ of data latching devices which may be clock gated together with the jth gating function $F_j$.

Clock gater 20 may then determine the flip-flops to be gated by each gating function $F_j$. For each gating function $F_j$, as controlled by a loop 84 over j, clock gater 20 may initialize (step 86) the flip-flops in gating group $H_j$ as "level 0" flip-flops. Clock gater 20 may then enter a loop 88 over i. In step 90, clock gater 20 may review the flip-flops of the circuit to find those which depend only on level i flip-flops in gating group $H_j$. These flip-flops may be labeled "level i+1" flip-flops and may be added to gating group $H_j$.

In step 92, clock gater 20 may check if any new flip-flops were added to gating group $H_j$ in step 90. If so, clock gater 20 may increment i, in step 94, and may continue in loop 88 until the result of step 92 is negative.

For each gating group j, clock gater 20 may generate the following gating function:

Gate the signals for the level 0 flip-flops with clock-gating function $F_j$;

Gate the signals for the ith level flip-flops with ith latched version of clock-gating function $F_j$.

The size of each gating group $H_j$ may be the number of flip-flops stored therein.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method comprising:

generating multi-cycle gating groups of data latching devices, on a processor, where each said gating group is associated with a single gating function and also comprising for each gating group, gating first cycle data latching devices of said gating group with said gating function and gating data latching devices of said gating group for subsequent cycles with a latched version of said gating function latched according to its cycle.

2. The method according to claim 1 and wherein said determining comprises:

ANDing said unfolded indicated signals together;

building a first binary decision diagram of said ANDed unfolded indicator signals;

generating a second binary decision diagram at a no change value; and for each cycle, removing variables of a second binary decision diagram of that cycle whose input is not from that cycle.

3. A method comprising:

generating multi-cycle gating groups of data latching devices, on a processor, where each said gating group is associated with a single gating function and also comprising for each gating group, gating first cycle data latching devices of said gating group with said gating function and gating data latching devices of said gating group for subsequent cycles with a latched version of said gating function latched according to its cycle;

and wherein said generating comprises:

finding a group of data latching devices of a circuit that depend only on an input signal;

determining a subgroup of the data latching devices of said group which share a gating function from the same cycle; and for each subgroup, adding the data latching devices of said circuit which receive input from existing data latching devices of said subgroup.

4. The method according to claim 2 and wherein said adding comprises:

for each initial subgroup, defining the data latching devices therein as initial level data latching devices; and for each higher level, adding a data latching device of said circuit to said subgroup as a next level higher data latching device if said data latching device depends only on a particular level data latching device already present in said subgroup.

* * * * *